United States Patent
Montelius et al.

(10) Patent No.: US 6,818,959 B2
(45) Date of Patent: Nov. 16, 2004

(54) MEMS DEVICES WITH VOLTAGE DRIVEN FLEXIBLE ELEMENTS

(75) Inventors: Lars G. Montelius, Bjerred (SE); Torbjorn G. I. Ling, Lund (SE); Andrej Litwin, Danderyd (SE)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 10/216,654

(22) Filed: Aug. 12, 2002

(65) Prior Publication Data

US 2003/0173647 A1 Sep. 18, 2003

(30) Foreign Application Priority Data

Mar. 12, 2002 (GB) .............................. 0205794

(51) Int. Cl.⁷ ............................... H01L 29/84
(52) U.S. Cl. ..................... 257/415; 257/618; 257/528; 257/595; 438/50
(58) Field of Search .............................. 257/415–420, 257/528, 595, 618; 438/50–53, 329, 379

(56) References Cited

U.S. PATENT DOCUMENTS

| | | | | |
|---|---|---|---|---|
| 6,232,847 B1 | | 5/2001 | Marcy et al. ............... | 331/167 |
| 6,275,320 B1 | * | 8/2001 | Dhuler et al. ............... | 359/237 |
| 6,325,904 B1 | | 12/2001 | Peeters ....................... | 257/414 |
| 6,541,831 B2 | * | 4/2003 | Lee et al. ................... | 257/415 |
| 6,587,612 B1 | * | 7/2003 | Mitchell et al. ............ | 385/18 |
| 6,590,267 B1 | * | 7/2003 | Goodwin-Johansson et al. ......................... | 257/415 |
| 2003/0015768 A1 | * | 1/2003 | Bosco et al. ............... | 257/528 |

FOREIGN PATENT DOCUMENTS

| | | |
|---|---|---|
| EP | 0932171 | 7/1999 |
| EP | 1120642 | 5/2001 |
| JP | 03012456 | 1/1991 |
| JP | 09055337 | 2/1997 |

(List continued on next page.)

OTHER PUBLICATIONS

L. Montelius et al, "Nanoimprint– and UV–Lithography: Mix&Match process for fabrication of interdigitated nano-biosensors", *Microelectronic Engineering*, Elsevier Publishers BV., Jun. 2000, vol. 53, No. 1–4, pp. 521–524.

L. Boggild et al., "Fabrication and Actuation of Customized Nanotweezers with a 25 nm Gap", *Nanotechnology*, Institute of Physics Publishing, Sep. 2001, vol. 12, pp. 331–335.

A. Boisen et al., "Environmental sensors based on micromachined cantilevers with integrated read–out", *Ultramicroscopy*, 2000, vol. 82, pp. 11–16.

(List continued on next page.)

*Primary Examiner*—Nathan J. Flynn
*Assistant Examiner*—Scott R. Wilson
(74) *Attorney, Agent, or Firm*—Miles & Stockbridge P.C.

(57) ABSTRACT

An array of nanometric dimensions consisting of two or more arms, positioned side by side, wherein the arms are of such nanometric dimensions that the beams can be moved or deformed towards or away from one another by means of a low voltage applied between the beams, whereby to produce a desired optical, electronic or mechanical effect. At nanometer scale dimensions structures previously treated as rigid become flexible, and this flexibility can be engineered since it is a direct consequence of material and dimensions. Since the electrostatic force between the two arms is inversely proportional to the square of the distance, a very considerable force will be developed with a low voltage of the order of 1–5 volts, which is sufficient to deflect the elements towards or away from one another. As preferred, the bulk of the element may comprise an insulating material, and an upper conductive layer is applied on the upper surface, where the element is formed by a nanolithography method such as nanoimprint lithography (NIL). Alternatively the elements may be formed completely of conductive material, where the elements are formed by a CMOS metalization process.

68 Claims, 9 Drawing Sheets

FOREIGN PATENT DOCUMENTS

| | | |
|---|---|---|
| WO | WO 00/77804 | 12/2000 |
| WO | WO 01/11395 | 2/2001 |
| WO | WO 01/11419 | 2/2001 |
| WO | WO 01/33226 | 5/2001 |
| WO | WO 01/48238 | 11/2001 |

OTHER PUBLICATIONS

Zhaoning Yu et al., "Reflective polarizer based on a stacked double–layer subwavelength metal grating structure fabricated using nanoimprint lithography", *Applied Physics Letters*, American Institute of Physics, vol. 77, No. 7, Aug. 14, 2000, pp. 927–929.

Boisen, et al; Ultra Microscopy, 82, (2000), pp 11–16.

Thundat, et al; "Chemical sensing in fourier space"; Applied Physics Letters 77 4061 (2000), pp 4061–4063.

Fritz et al; "Translating Biomolecular Recognition into Nanomechanics"; Science, vol. 288, Apr. 14, 2000, pp 316–318.

Yu, et al.; "Reflective Polarizer Based on a Stacked Double–Layer Subwavelength Metal Grating Structure Fabricated Using Nanoimprint Lithography"; Applied Physics Letters, 77(7), Aug. 14, 2000;pp 927–929.

Walker; "MEMS technology in optical layer networks"; 2001, Electronic Components and Technology Conference, IEEE, pp. 416–422.

Husain; "MEMS–based photonic switching in communications networks"; pp WX1–1–WX1–3 (2000).

Li, et al: Three–dimensional optoelectronic stacked processor by use of free–space optical interconnection and three dimensional VLSI chip stacks; Jan. 2002, Applied Optics, vol. 41, No. 2, pp 348–360.

Husain; "Photonic MEMS switch applications"; 2001, Proc. SPIE, vol. 4532, pp 41–49.

Burke; "Photonic MEMS switch applications"; 2001, Proc. SPIE, vol. 4532, pp 41–49.

Neukermans: "MEMS technology for optical interconnect and networking applications"; 2001, IEEE, pp 732–733.

Allan; "MEMS technology propels telecom systems toward an all–optical network"; Apr. 2001, Electronic Design, pp 67–74.

Lee, et al; "Optical and RF MEMS devices for electronic circuits"; 2000 International Conference on High–Density Interconnect and Systems Packaging, pp 104–107.

Yeow, et al; "MEMS optical switches"; Nov. 2001, IEEE Communications Magazine, pp 158–163.

Dobbelarre, et al; "Digital MEMS for optical switching"; Mar. 2002, IEEE Communications Magazine, pp 88–95.

Scotti, et al: "The challenges of packaging MEMS components for the all optical networks of the future"; Proc. SPIE, vol. 4408, pp 19–27; 2001.

Chu, et al "MEMS: The path to large optical crossconnects"; Mar. 2002, IEEE Communications Magazine, pp 80–87.

Liu; "MEMS technology and explosive growth fibre optical communication"; Proceedings of SPIE, 2001, vol. 4595, pp 67–73.

Boggild, et al; "Customizable nanotweezers for manipulation of free–standing nanostructures"; IEEE–Nano, 2001, pp 87–92.

Hoivik, et al; "Flip chip variable high Q MEMS capacitor for RF applications"; Proceedings of IPACK–01 The Pacific RIM/ASME International Electronic Packaging Technical Conference and Exhibition; Jul. 8–13, 2001 ; pp 97–102.

Godil; "Diffractive MEMS for optical networks"; MEMS & Nanotechnology; Mar. 2002, pp 43–44.

Gimzewski, et al "Nanoscale science of single molecules using local probes"; Mar. 12, 1999, Science, vol. 283, pp 1683–1688.

Jensenius, et al; "A microcantilever–based alcohol vapor sensor–application and response model"; Applied Physics Letters; May 2000, vol. 76, No. 18, pp 2615–2617.

* cited by examiner

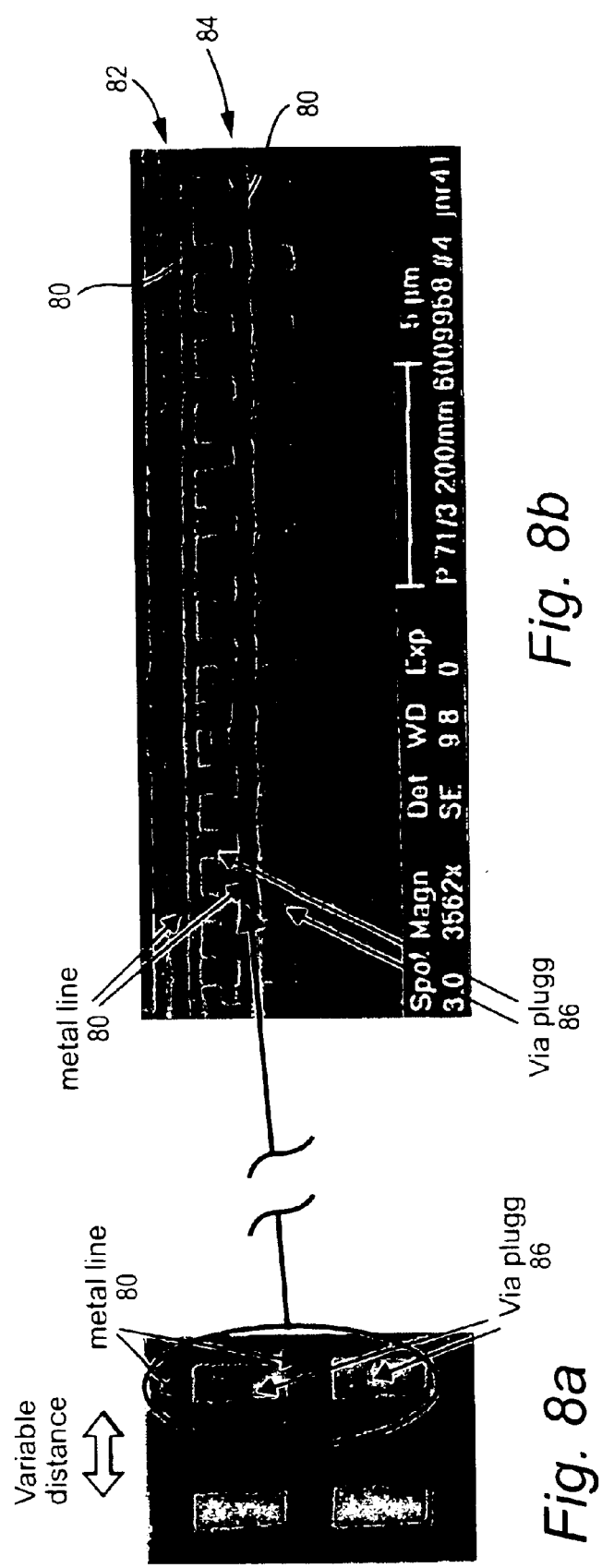

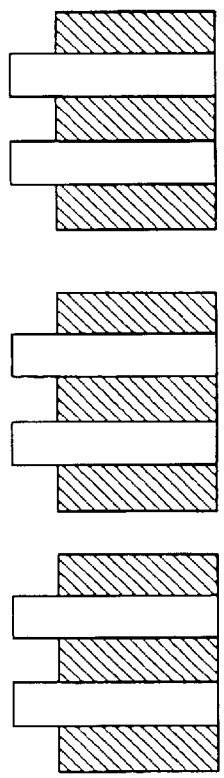
Fig. 9a
Fig. 9b
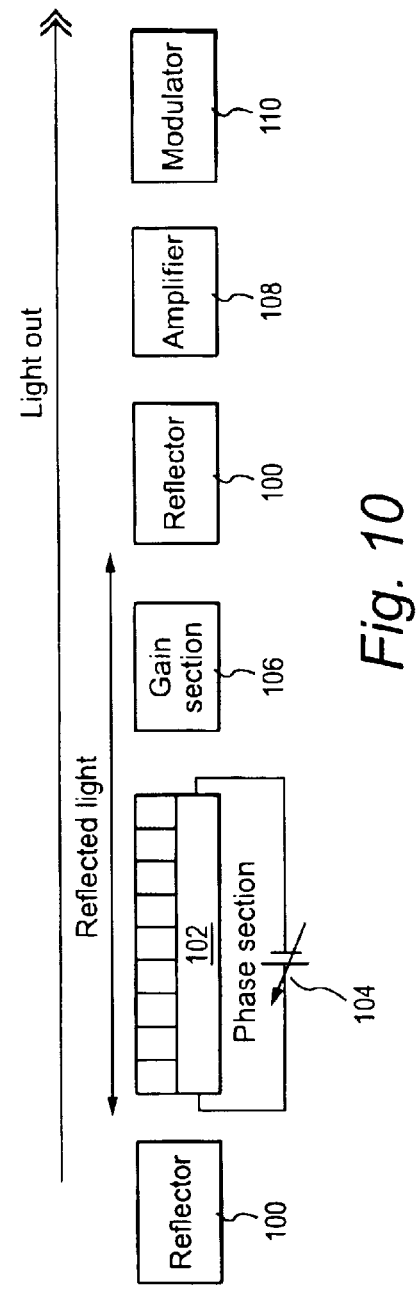
Fig. 10

Fig. 15a
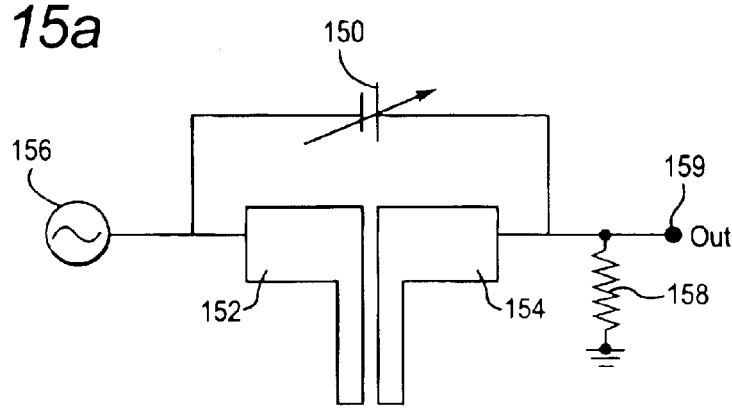
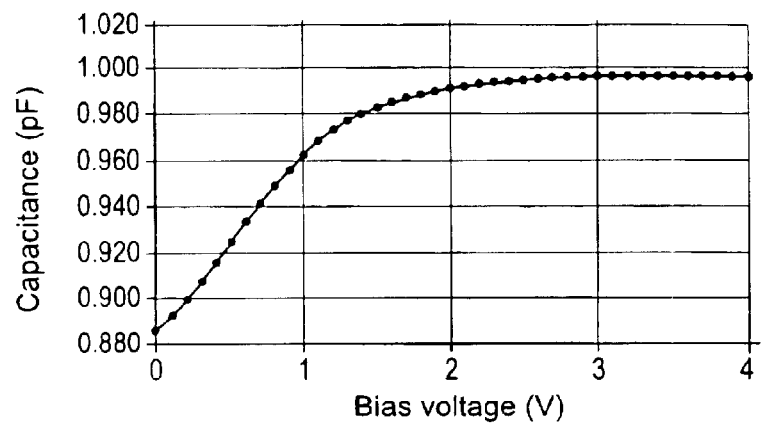
Fig. 15b
Fig. 16a
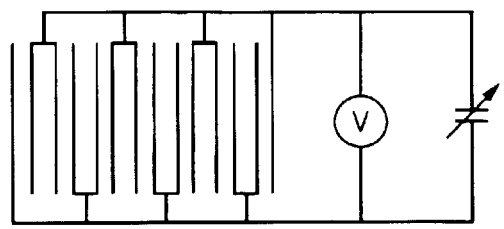
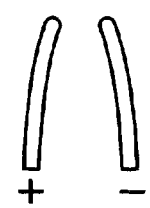
Fig. 16b
Fig. 17
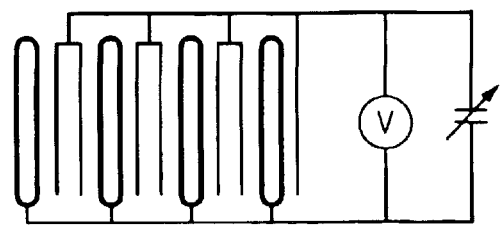

MEMS DEVICES WITH VOLTAGE DRIVEN FLEXIBLE ELEMENTS

The present invention relates to micromechanical systems (MEMS) devices, particularly though not exclusively to such systems formed on a nanometer scale.

Commonly, MEMS devices are integrated within a monolithic integrated circuit, but the additional processing required for a required function is very product specific and often cumbersome. Many of the devices depend on vertical movement of suspended beams, which necessitates removal of the material under the beam, which is a problem; see for example EP-A-0932171.

Devices using cantilever beams, which deflect under an applied force, are well known. Cantilevers, which deflect under the weight of molecules absorbed on the surface of the beams are disclosed in A Boisen, J Thaysen, H Jensenius, O Hansen, Ultra Microscopy, 82, 11 (2000). A large array of interdigital cantilevers which move under the weight of absorbed molecules is disclosed in T Thundat, E Finot, Z Hu and R H Ritchie, Applied Physics Letters 77 4061 (2000). In this arrangement deflection of the elements of the array changes the diffraction pattern of an incident beam. "Translating Biomolecular Recognition into Nanomechanics" Fritz et al, Science, Vol. 288, 14 Apr. 2000, pp 316–319 discloses cantilevers which selectively bend as a result of surface stress changes caused by specific transduction of DNA hybridisation and receptor ligand binding to provide a true molecular recognition signal.

In another application, a reflective polarizer consisting of two layers of 190 nm period metal gratings is fabricated using nanoimprint lithography: see "Reflective Polarizer Based on a Stacked Double-Layer Sub-Wavelength Metal Grating Structure Fabricated Using Nanoimprint Lithography", Z Hu, P Deshpandy, W Wu, J Wang, S Y Chou, Applied Physics Letters, volume 77, no. 7, 14 Aug. 2000.

SUMMARY OF THE INVENTION

It is an object of the invention to provide an improved MEMS device for fabrication in a comparatively simple and inexpensive manner, at nanometer dimensions.

The concept of the present invention is to provide an array of nanometric dimensions consisting of two or more longitudinal elements, positioned side by side, wherein the beams are of such nanometric dimensions that the elements can be moved or deformed towards or away from one another by means of a voltage differential applied between the elements, whereby to produce a desired optical, electronic or mechanical effect.

For the purposes of this specification, the term "longitudinal element" includes fingers, arms, legs, longitudinal elements, or lines.

The invention may in some forms include two dimensional elements such as plates.

We have realised that at nanometer scale dimensions structures previously treated as rigid become flexible. Furthermore this flexibility can be engineered since it is a direct consequence of its material and dimensions. As preferred the dimensions of the elements are typically of a width, between 10 and of the order of 100 nanometers and of a length of the order of micrometers. The elements are spaced apart a distance between 10 and of the order of 100 nanometers. Since the electrostatic force between two elements is inversely proportional to the square of the distance, a very considerable force will be developed with a low voltage of the order of 1 or 2 volts or 5 volts, which is sufficient to deflect the elements towards or away from one another.

Among the various possibilities for mounting the elements, it in not preferred to have them fixed only at one end and for them to be freely moveable under the influence of an electric field along their length towards and away from one another. A disadvantage of this in terms of processing in that it is necessary to etch or otherwise remove material from beneath the elements so that they are spaced from the substrate to enable movement. In a preferred form of the invention, the elements are fixed to an underlying substrate, preferably along their whole length, or at the least, at two spaced apart points along their length (preferably one point is at one end), so that when an electrostatic field is applied across the elements by means of a voltage differential, the upper and distal parts of the elements remote from the fixing bend relative to one another, whereas lower parts of the elements and parts close to the fixings of the elements, remain stationary. The advantage of such a system is that it is easy to manufacture by means of known manufacturing techniques, but yet provides sufficient movement for desired functions.

For the purpose of this specification, "upper" and "lower" are to be understood in a relative sense, and do not imply any orientation of the device relative to its environment.

As preferred, the bulk of the element may be formed from either an insulating material, and then an upper conductive layer is applied on the upper surface, or alternatively the element may be formed completely of conductive material and then there is no need to apply a top conductive layer. These configurations permit a voltage differential to be developed across the elements.

The insulating material of the element may be, where the element is formed by a nanolithography method such as nanoimprint lithography (NIL), a resist such as PMMA, which is used in the NIL process.

Alternatively where the elements are formed by a CMOS metalization process, or by the nano xerography process as disclosed and claimed in our international application WO 01/84238, the elements may be formed of any desired material which is suitable for use in the process (such as a metal or semiconductor or insulating material).

The device according to the invention may be used in a variety of applications:- a variable capacitor—filter circuit. By applying a bias voltage between two electrode elements, the distance between them is changed and therefore the capacitance. An AC signal passed through the capacitance thus experiences a capacitance dependent on the bias voltage.

GHz—resonator/RF applications. Because of the very small size of the elements they would show a mechanical resonance frequency in the GHz range. This frequency can be tuned by applying a potential.

Biosensor—few or single molecule detection. The resonance properties mentioned above can be used in mass sensitive biosensors. Where the elements are exposed to an atmosphere where desired molecules may be absorbed onto the element surface, this alters their weight and hence also their resonance frequency. It is therefore possible to get a very sensitive measure of weight.

Optical switch at the GHz level. In an array of a large number of elements positioned side by side with a spacing of the order of hundreds of nanometers, a grating is formed with spacing below the wavelength of light (of the order of 1000 nanometers). The spacing of the elements in such an arrangement determines an apparent refractive index of the structure as experienced by incident light. By applying appropriate voltages, the elements deform relative to one another in a non-linear way, which alters the apparent refractive index. This permits an optical switch to be fabricated allowing high frequency operation, of the order of GHz.

BRIEF DESCRIPTION OF THE DRAWINGS

Preferred embodiments of the invention will now be described with reference to the accompanying drawings wherein:

FIGS. 7a and 7b and FIGS. 8a and 8b are top and end views of two specific examples of the second embodiment;

FIGS. 9a and 9b show a further modification of the second embodiment;

FIG. 10 is a schematic view of an application of the second embodiment to a tuneable laser;

FIG. 15a is a schematic view of an application of the first embodiment to a variable capacitor filter, and FIG. 15b is a graph indicating the variable capacitance of the filter; and FIGS. 16a and 16b and FIG. 17 are schematic views of an application of the second embodiment to varactors.

DESCRIPTION OF THE PREFERRED EMBODIMENTS

In accordance with the invention it has been realised, that going down into nanometer scale features, the structures that previously have been treated as rigid become flexible. Furthermore, this flexibility offered can be engineered since it is a direct consequence of its dimensions and materials. This opens a possibility of new solutions for nanomechanical systems that can be integrated with 100 nm.

The present invention, in at least preferred embodiments, creates variable distance gratings, where the adjustment of the distance is due to electrostatic forces. In its simplest form a grating consists of parallel metal or composite lines, (formed as two or more layers where one of the layers of the lines is a conductive layer), produced in a very similar way as metal interconnects on integrated circuits, but with the dimensions for the lines and spaces under 150 nm. If not passivated, the metal lines will bend laterally towards each other, when an electric field is applied between them along the length of the metal line. Adjusting the layout and the lateral dimensions it is possible to control the function and the physical properties of the lines to fit the application, without affecting the manufacturing, e.g. by one simple polymer patterning step and subsequent evaporation of metal. A feature distinguishing the invention from other known solutions, in which the movement is substantially vertical, is that the metal lines deflect laterally when the voltage is applied between the neighbours. Since they are in physical connection with the underlying substrate, either along their whole length of the line, or at intervals, no vertical movement is possible or desirable. Furthermore, for composite lines, since the physical and chemical properties of the chosen layer beneath the electrode layer, e.g. being a polymer, can be engineered at will, one can easily create a "designed" element, having physical properties such as e.g. flexibility as well as chemical properties such as e.g. tailored chemical adsorption on its faces. Thus, depending on application one can tailor the performance without changing the actual fabrication.

Figure 1:
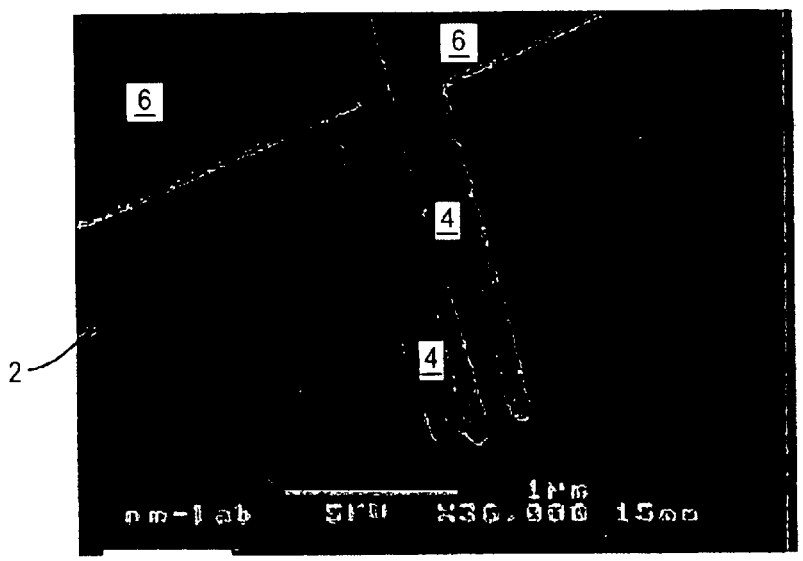
FIG. 1 and FIG. 2 are top and perspective views respectively, of a first embodiment of the invention.
Figure 2:
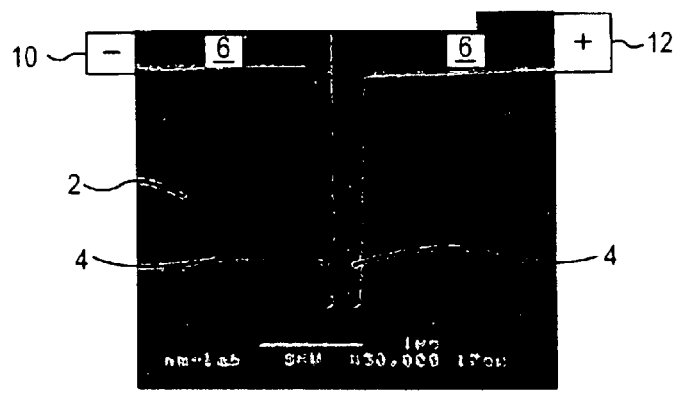
Figure 3:
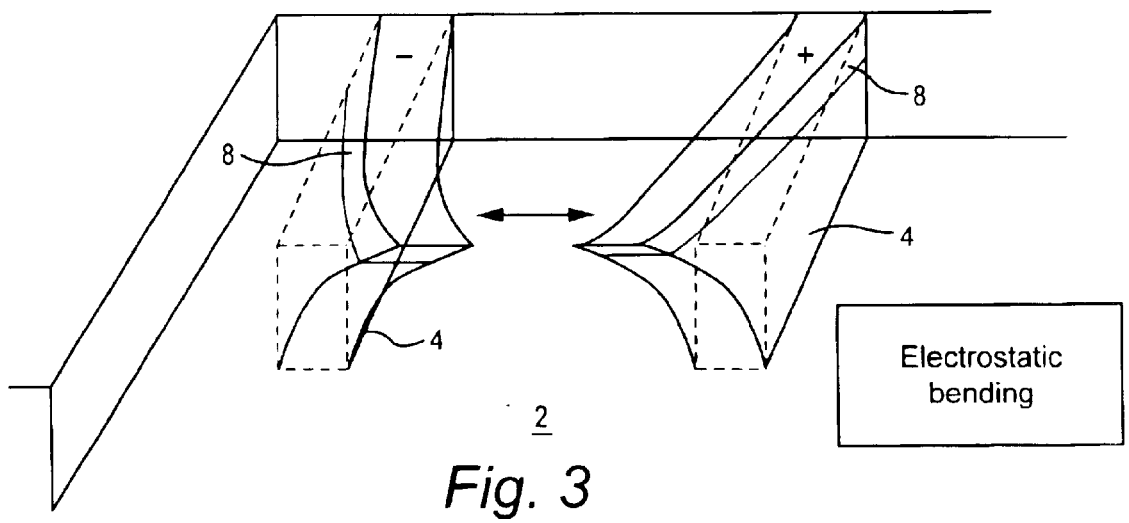
FIG. 3 is a schematic perspective view of the bending action of the two elements of FIGS. 1 and 2 when a voltage differential is applied therebetween.

Referring now to FIGS. 1, 2 and 3 there is disclosed a first embodiment of the invention comprising a substrate 2 of silicon from which upstands two parallel arms 4 formed of PMMA (polymethyl methacrylate). Each arm is 100 nm wide, about 200 nm in height, and is spaced from the other arm by a distance of 200 nm. Each arm 4 is formed integrally with a respective base region 6 of PMMA, forming a contact pad. The upper surfaces of arms 4 and bases 6 have an electrically conductive metal layer 8 thereon. Bases 6 have respective terminal regions 10, 12.

In operation, as shown schematically in FIG. 3, when a low voltage of about 1–5 volts is applied across terminals 10, 12 the electrical force generated between the arms 4 is sufficient to cause bending or deformation of the upper parts of the free ends of the arms towards one another as shown. The degree of bending can be controlled by the voltage applied, or by the thickness of the arms 4 or by the material of which the arms are formed. Since the arms are fixed at their lower sides to substrate 2, the bending action is a complex non-linear action, and not a simple linear movement.

Figure 4A:
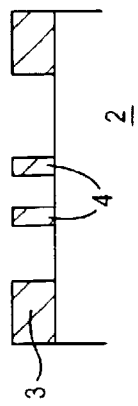
FIGS. 4a to 4d illustrate process steps in the formation of the embodiment of FIG. 1.
Figure 4B:
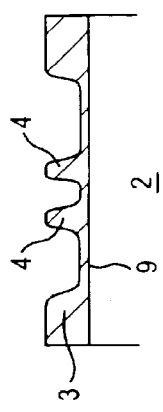

The method of forming the first embodiment is shown in FIGS. 4a to 4d. In FIG. 4a a silicon substrate 2 has a layer of PMMA spun onto its upper surface, 3. A stamp 5, precisely dimensioned, has formed on its lower surface a desired pattern 7. The stamp is pressed into the glass temperature heater polymer on top of the substrate material, causing a relief structure in the resist which is formed as the opposite replica of the structures in the stamp. When the stamp/substrate package is cooled and removed from each other the imprinted relief structure remains in the resist layer. The result is shown as in FIG. 4b where the arms 4 upstand from the surface. There is a residual amount of PMMA 9 in the regions between the arms 4 and on the outer sides of arms 4.

Figure 4C:
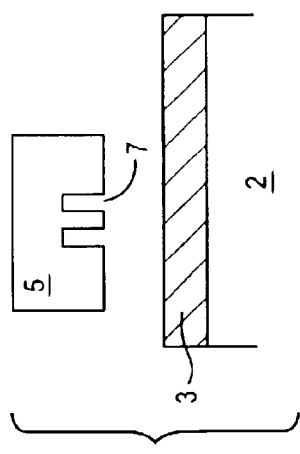
Figure 4D:
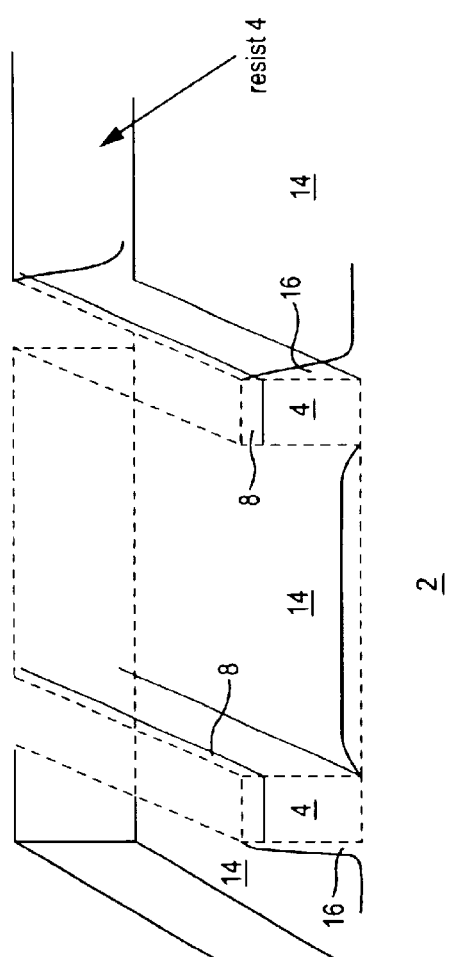

As shown in FIG. 4c, this residual material 9 is removed by etching to expose the silicon substrate. This whole structure may then be coated with a metal 8, as shown in FIG. 4d. The metal on top of the beams has to be separated in order to be able to put a voltage between the two beams. For example, a metal layer 8 may simply be deposited on the substrate and arms 4 by a vapour deposition process. This will involve metal residing in the space 14 between the arms 4 and on the outer sides of the arms 16, but this may be acceptable for certain applications.

The bottom metal layer 14, 16 does not affect the top layer since the layers are vertically disconnected from each other.

Figure 5:
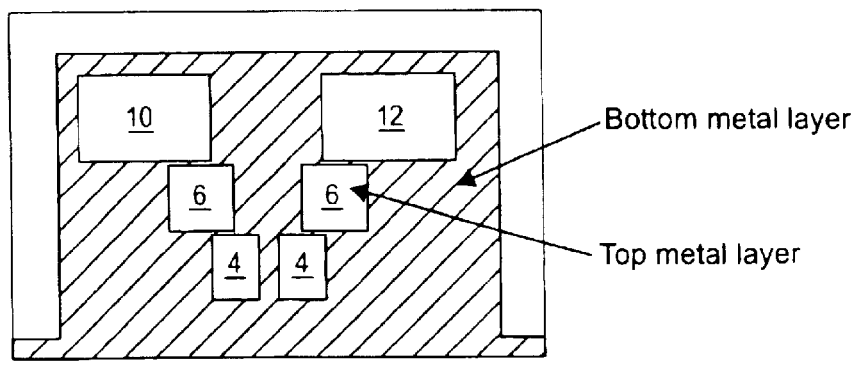
FIG. 5 is a top view of the first embodiment, indicating how the electrode elements are connected to the outer world.

Referring to FIG. 5, this shows how regions 4, 6, 10, 12 are made progressively layer to enable electrical contact with the outside world.

The same kind of resist structures may be formed with other nanolithography techniques such as electron beam lithography, extreme UV-lithography, ion beam and X-ray lithography and soft imprint techniques.

It is not necessarily so that the arms or beams have to be manufactured from a resist material. The resist pattern formed as described above can be used as a template to make beams of other material(s). Then instead of making a polymer pattern with a footprint as in FIG. 4 the wafer is processed so that the resist remains at parts and then one may add the beam construction material over the entire structure, e.g. it could be a metal that is evaporated on top of the whole surface. The next step would be to remove the metal-covered resist layers arid then one would have beams of the material evaporated/added.

Alternatively, instead of adding material on top of the whole substrate, the material that is not protected by the resist layer is etched. Then, when etched as deeply as necessary and removing the etching mask, i.e. the resist layer, a structure similar to FIG. 1 above would be provided with the exception that the beams were made out of the substrate material.

Since in all of these possibilities, the material of the beam may be chosen at will, the electric, mechanical and optical as well as the surface properties of the employed beam material can be selectively tailored. For instance, the resist could have a certain kind of molecules at the surface that promote the adhesion of the molecules that are to be detected. Also, if the desired surface properties are not an inherent material property one could functionalise the beam surface with known methods, e.g. if the surface is silicon one could use silane chemistry to attach the needed end groups in order to "functionalise" the beam surface. Also, depending on the mechanical property of the beam material it would be possible to tailor the response to a certain chemical action on the beam.

Figure 6A:
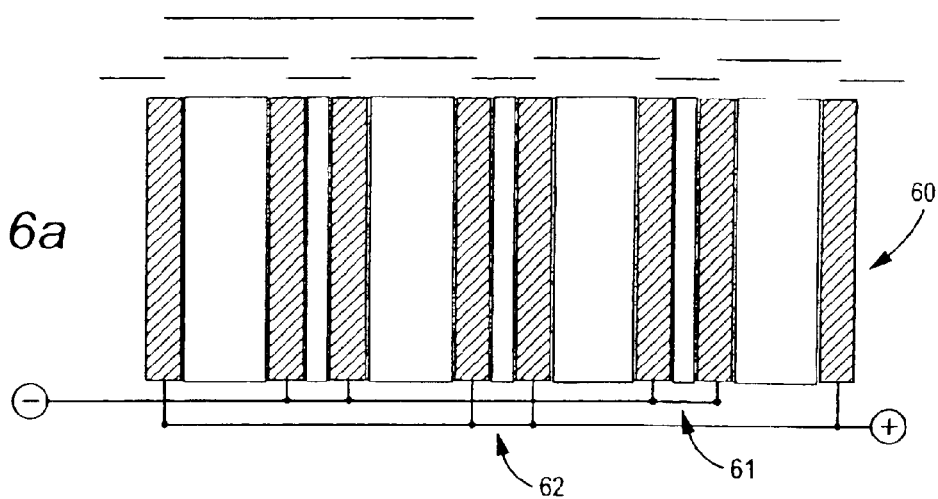
FIGS. 6a to 6f are schematic views of various forms of a second embodiment of the invention, forming a sub-wavelength diffraction grating.
Figure 6B:
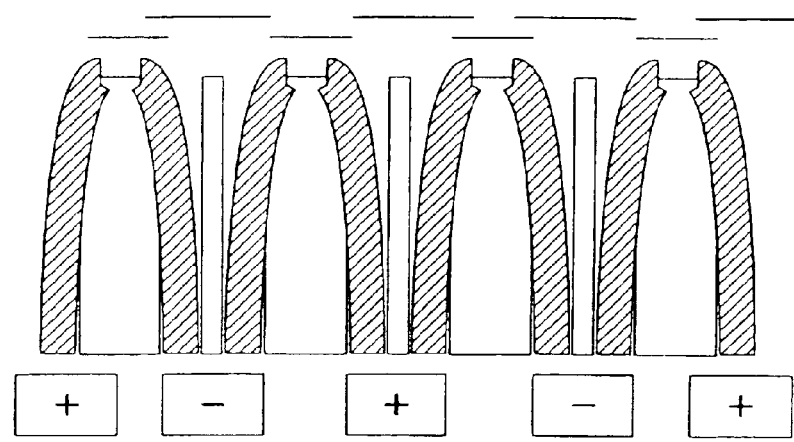
Figure 6C:
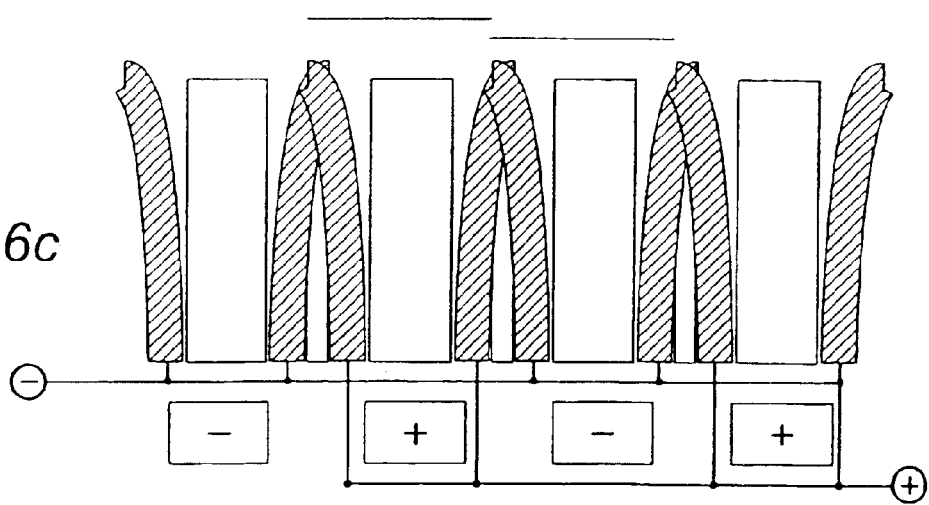
Figure 6D:
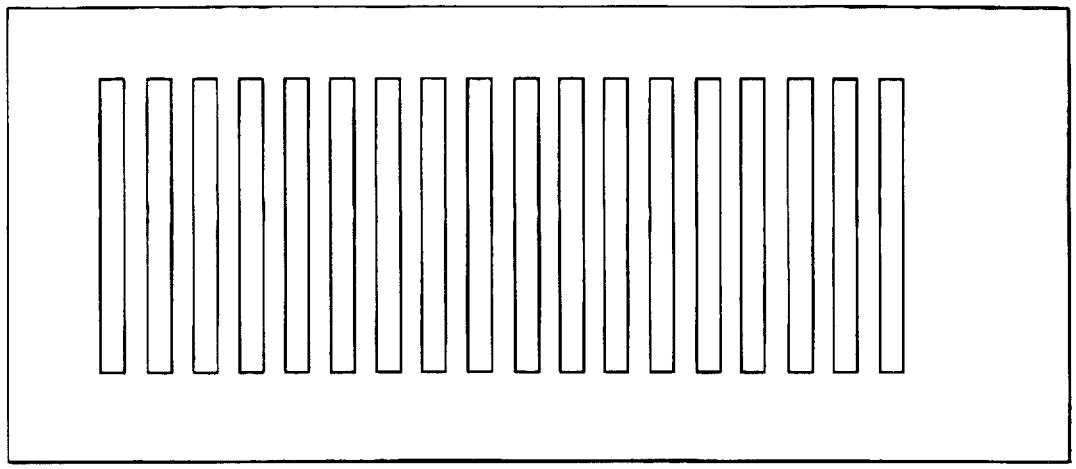

Referring now to FIGS. 6a–6f showing a second embodiment of the invention, this forms a sub-wavelength diffractive grating. The schematic view in FIG. 6a shows an array of a large number of arms, fingers or beams 60, formed as two interdigitated sub-arrays 61, 62. Sub-arrays 61,62 are respectively connected to negative and positive voltages. Each arm 60 is of the same construction as arm 4 of FIG. 1. Adjacent arms 60 of respective sub-arrays 61, 62 are spaced by a distance of for instance 300 nm. Each pair of arms is spaced from an adjacent arm by a distance of for instance 100 nm. The arrangement shown forms a sub-wavelength diffraction grating. When light is incident on the grating, since its wavelength (~1000 nm) is far greater than the distance between the grating elements, the light experiences a medium with a certain refractive index. When a voltage is applied across the sub-arrays, adjacent arms bend away from one another, as indicated in FIG. 6b. This non-linear bending movement creates a change in the apparent refractive index experienced by incident light. In an alternative configuration, as shown in FIG. 6c, a different permutation of the arms forming the sub-arrays is employed, wherein adjacent arms spaced by a distance of 100 nm belong to different sub-arrays. In this arrangement, the arms bend much more closely together under applied voltage, to produce a different range of apparent refractive index.

Figure 6E:
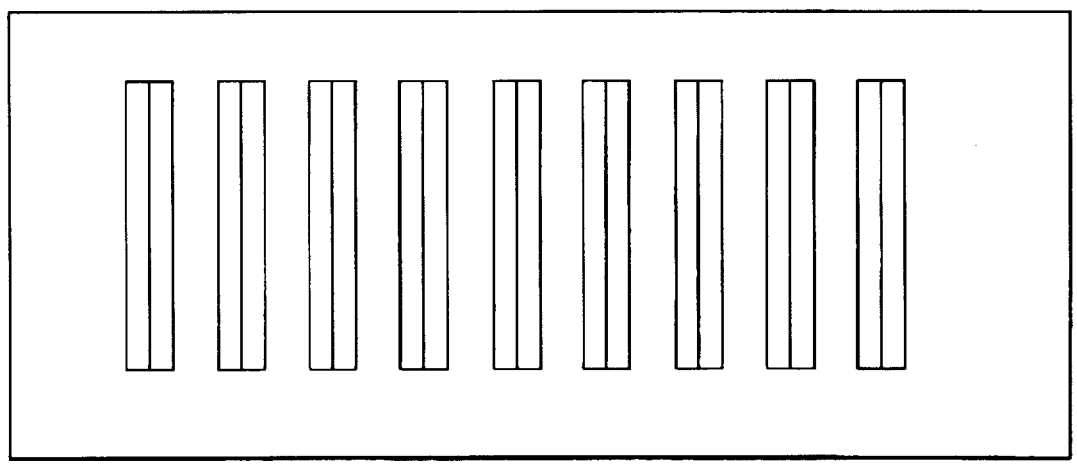
Figure 6F:
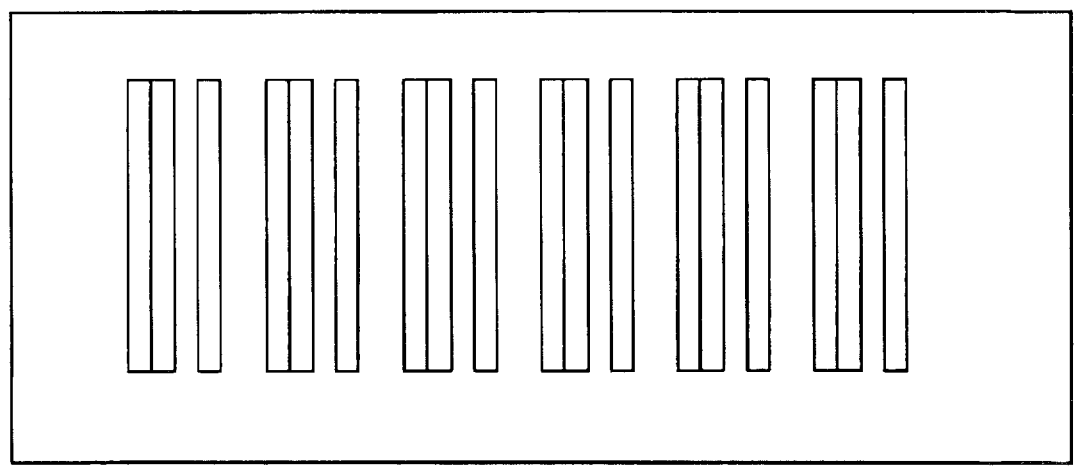

In a sub wavelength diffraction grating, depending on the period and pattern of the array of grating elements, the grating will have different diffractive effects. For example, a set of beams like shown in FIG. 6d could be tuned to have a variable grating period by allowing the different elements to actually touch each other, if every pair of elements are bunched together the period would have been reduced a factor of 2 (FIG. 6e). If only 50% of the pairs would be bunched together the period would be a different one (FIG. 6f). If 3 elements were bunched together, another period would be obtained etc etc. The variation possibilities are indeed large with these kind of structures.

Figure 7A:
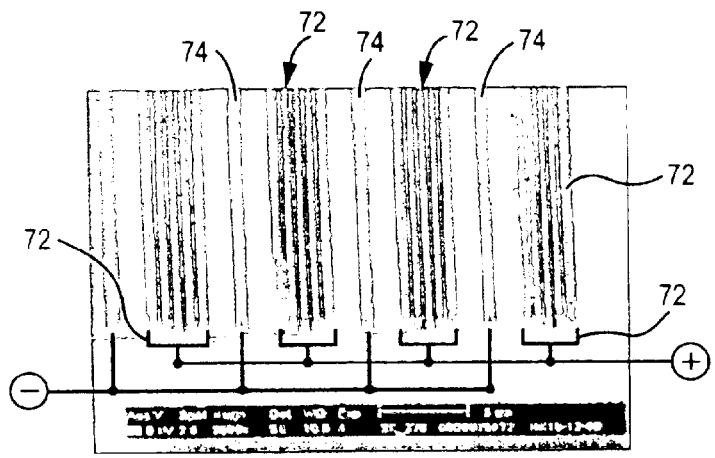
Figure 7B:
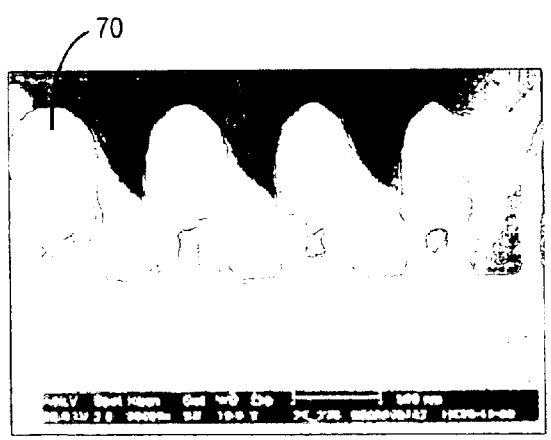

A specific example of the second embodiment is shown in FIGS. 7a and 7b, where metal lines 70 are formed from interconnect layers of a CMOS process, and are grouped together in groups of five arms 72 with intermediate arms 74 positioned between groups 72. The five arms of subgroup 72 are spaced 100 nanometers apart.

The arms are connected up as shown for creating appropriate bending action when external voltage is applied to the sub-arrays.

A second example of an implementation of the second embodiment is shown in FIGS. 8a and 8b wherein metal lines 80 are stacked one on top of the other in two layers 82, 84, and are connected to each other and to the substrate by tungsten filled vias 86. The distance between the metal lines is preferably smaller than 200 nm, to avoid the excessive voltage that has to be applied to bend the grating lines towards each other in FIG. 8a. However, the stiffness of the line can be adjusted by choosing the spacing of the vias in FIG. 8b. Fewer vias means reduced stiffness of the structure and the force necessary to bend the grating lines will be reduced, and consequently the applied voltage will be reduced. The smallest amount of vias two, one close to each end of the grating line. Using vias enables connecting the grating lines to the desirable voltage from underneath, either another metal interconnect line, or directly to the active areas of a silicon transistor.

This type of variable grating may be of use in various optical applications. For example, such a variable grating may have extreme polarisation effects gratings. In its easiest approach it would be a grating such as FIGS. 6a to 6f above. When the two beams bend a lot, the proportion of the bottom surface (the surface between the bending beams) to the top beam surface can vary and thus less bottom surface is exposed to an incident beam (shown schematically in FIGS. 9a and 9b) while the area of the top surface is not at all affected.

This kind of optical anisotropy in reflection mode due to the polarisation effects can provide construction of viewing screens that dynamically change reflectivity, i.e. may dynamically produce images on its screen depending on how the beams are arranged. Application areas can for instance be large advertisements stands that by adjusting the voltage can deliver advertisements that dynamically change e.g. over the day.

Another application is a tuneable grating for a semiconductor laser diode. Referring to FIG. 10, a sampled grating distributed Bragg reflector laser comprises reflectors 100, a phase section 102 formed as a grating as shown in FIGS. 6a to 6f, controlled by a variable voltage source 104, a gain section 106, an amplifier section 108, and a modulator 110. Voltage source 104 determines the apparent refractive index of phase section 102, and hence the wavelength of operation of the laser. This makes it possible to make real time tuning of the emitting wavelength. This serves two purposes, either to tune the single mode laser wavelength or to actually make in situ wavelength multiplexed lasers having multiplexing speed in the GHz range.

Another application is as a radar deflector. If a surface of e.g. an aircraft is dressed with these kinds of elements that change their period etc as a function of voltage at a GHz range, would make an incoming GHz radar pulse to be adsorbed instead of reflected and hence the carrier would not be visible on the radar screen.

Figure 11:
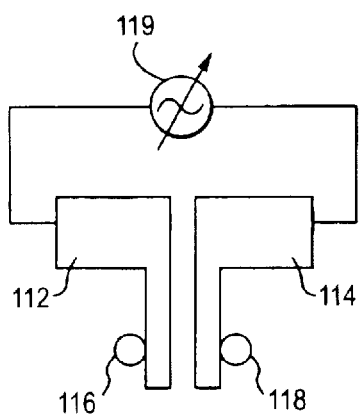
FIG. 11 is a schematic view of an application of the first embodiment to a sensor for single molecules.

Another application is as an extreme high sensitive biosensor that can sense down to attograms, i.e. to the single molecule level, as shown in FIG. 11. The upper surface of the two arms 112, 114 as shown in FIGS. 1 to 3, have a coating of a material, e.g. a silicon surface coated with a layer of APTS (aminopropyltriethoxisilane) which have functional aminogroups that can immobilize certain kinds of molecules directly or onto which another layer of binding molecules have been attached via the aminogroups allowing the exposed binding molecules to bind a certain target molecule (e.g. allowing an antigene-antibody binding event to take place). In any case the coating enables bonding of a single molecule, or a plurality of molecules, shown schematically at 116, 118. The molecules are of a desired species, e.g. DNA. When bonded, the molecules change the mechanical resonant frequency of the arms 112, 114. The resonant frequency is detected by a variable GHz voltage source 119. It would be feasible to use such a structure as protein detectors in protein chips or for DNA-analysis without the need to multiply a DNA segment that present state-of-the-art detectors need in order to get enough material so it can be detected.

Another application of the structure shown in FIG. 11 is the one-cell fermentor. A minute mass change is detected that occurs when a cell is growing. It requires that a whole cell can be attached to the surface of the beam. The sensitivity would probably be so high that one easily could detect e.g. the effect of pharmaceutical treatment on e.g. a cancer cell or something similar. Today a lot of animal tests are done when a new drug is being developed. These kind of tests could then be replaced.

Figure 12:
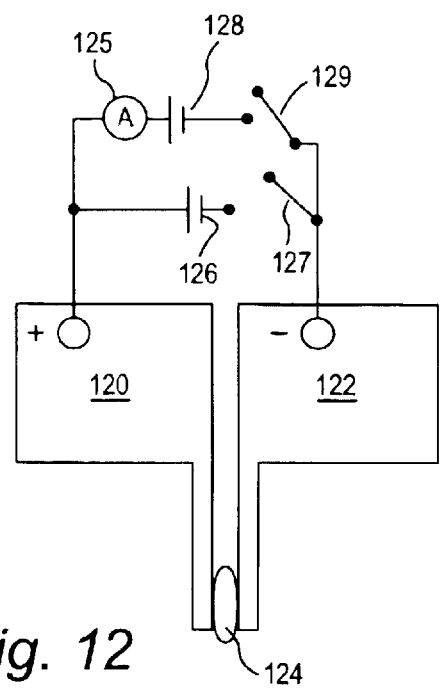
FIG. 12 is a schematic view of an application of the first embodiment to a "nanotweezer"
Figure 13:
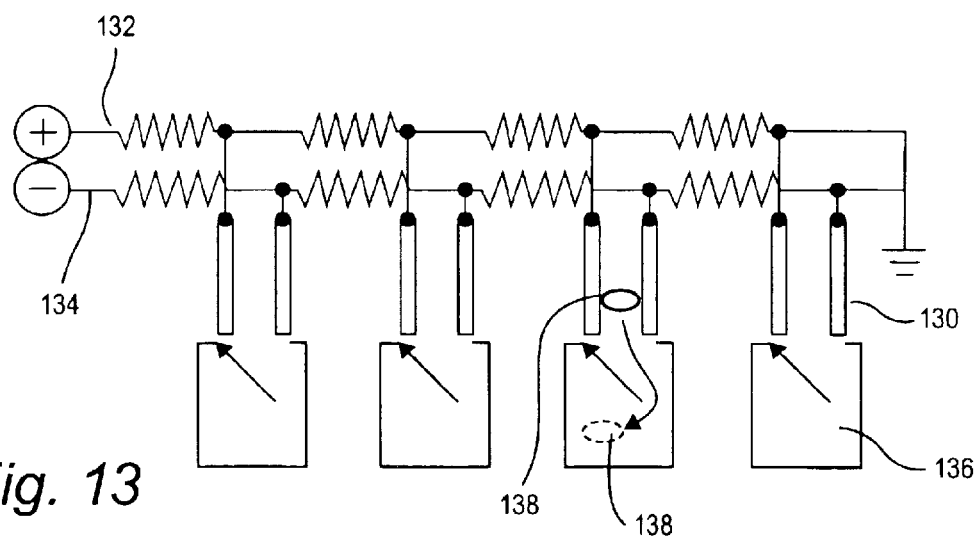
FIG. 13 is a schematic view of an application of the first embodiment to the sorting of charged molecules.

An application shown in FIG. 12 is a nanotweezer. Two arms 120, 122 shown in FIGS. 1 to 3, upon application of a voltage 126 when a switch 127 is closed, grab an object 124 between the two bending elements. An analysis of the object may then be performed e.g. to monitor the resistance of the object by application of a further voltage 128 by closing a switch 129 and monitoring the current at 125. By putting a large current one could heat or melt the object. This could be used e.g. in cancer therapy if one selectively could attach the cancer object between the tweezers. This could be done, by selective coating of the tips of the bending beams, or by a chemical coating of the object in such a way that it is electrically active, then a voltage between the bended "tips" would make an electric field that could be used to capture the electrically charged object. In a modification, moloculos molecules having different charge may be sorted as shown in FIG. 13. An array of element pairs 130, each pair as shown in FIGS. 1 to 3, have different voltages applied to them via potential divider chains 132, 134. Each element pair 130 has a compartment 136 beneath it. In use, with different voltages applied, there would be a track of different electrical fields that would make it possible to capture species 138 of different charges along the track, when captured between arm pairs 130 (tweezers). When the voltage is relaxed, the tweezers relax, and a module 138 is released and falls down into compartment 136, whence it may be transported away or just collected.

Figure 14:
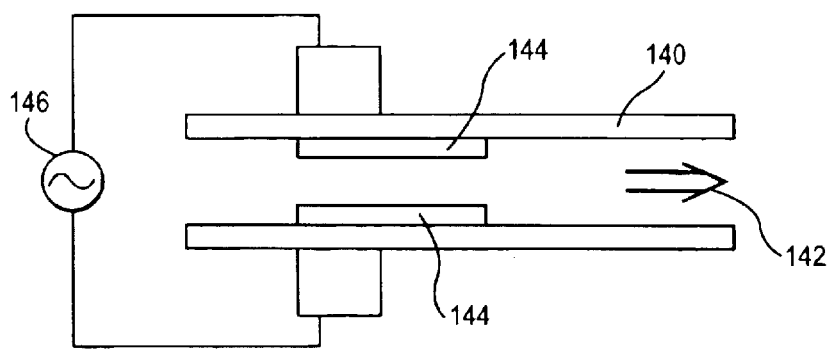
FIG. 14 is a schematic view of an application of the first embodiment to a pump for pumping fluid in nanodimensioned pipes.

A pump application is realised as shown schematically in FIG. 14. A pipe 140 defining a flow channel for fluid 142, this has a pair of bending elements 144 inside a flow channel. The bending elements are as shown in FIGS. 1 to 3 and when they are excited by an AC signal 146 they will move towards and from each other in phase with the AC-frequency and hence produce a pumping effect on the fluid in the channel. Such effects will depend on e.g. the size of the channel, surface tension, capillary effects, surface coatings etc.

An application of the first embodiment of the invention is shown in FIG. 15 as a variable capacitance filter. An adjustable DC voltage 150 is connected across terminals 152, 154 and an AC signal source 156 is connected to terminal 152. Terminal 154 is connected to a resistor 158, and to an output port 159.

A specimen characteristic of the capacitance of the device versus applied voltage is shown in FIG. 15b from which it may be seen the capacitance varies by about 10% over a bias range of 2 volts.

Such a variable capacitor, varactor, is realised using the variable distance metal grating, shown in FIGS. 1 to 3. In the simplest embodiment only two parallel grating lines are necessary, connected to the signal and control voltage circuits. When the DC voltage is applied between the lines, the resulting electrostatic force will bend the grating lines towards each other, FIG. 16b. The resulting decrease in distance between the electrodes will increase the capacitance between the lines, changing as an inverse of said distance. To avoid a short circuit in the case when the lines touch, a thin dielectric layer may cover the metal lines, e.g. if the grating lines are made of aluminium they may be oxidised to form $Al_2O_3$ on the metal surface. Other types of dielectric deposited by PVD or CVD techniques are possible.

Using a grating consisting or more than two metal lines with equal width requires an even number of lines, where each two neighbours are connected together, FIG. 16a.

A variety of the varactor grating can be realised by designing lines connected to one common electrode stiffer than the lines connected to the other electrode e.g. by making them wider as in FIG. 17. As a result only the narrower metal lines connected to the other electrode will bend. Such design may result in better uniformity at the cost of lower voltage sensitivity.

RF

The RF switch is a particular form of varactor and can be realised in a similar way as described above. The difference is that the control voltage will assume only two values, one for the on-condition, with high varactor capacitance or even short circuit if the grating lines aren't covered with dielectric, and one for the off-condition with low capacitance to block the RF signal.

What is claimed is:

1. A MEMS device comprising an array of two or more longitudinal elements positioned on a substrate, and positioned side by side, the elements being at least in part electrically conductive, and including means for applying a voltage across the elements, wherein the elements are connected to the substrate at lower longitudinal sides thereof and of such nanometric dimensions and materials that the elements can be moved or deformed towards or away from one another by means of the voltage applied across the elements, whereby to produce a desired optical, electronic or mechanical effect.

2. A device as claimed in claim 1, wherein each element is connected to the substrate along substantially the entire length of its lower longitudinal side, so that only the upper part of the element moves.

3. A device as claimed in claim 1, wherein each element is connected to the substrate at two or more spaced apart points along its lower longitudinal side.

4. A device as claimed in claim 1, wherein each element is formed of insulative material, with an upper layer of conductive material.

5. A device as claimed in claim 4, wherein each element has a portion formed of a polymer.

6. A device as claimed in claim 5, wherein each element has a portion formed of polymethyl methacrylate.

7. A device as claimed in claim 6, including an upper surface coating on each element, the coating having a functional group for reacting with desired molecules to retain the molecules on the upper surface.

8. A sensor for single or a few molecules, including a device as claimed in claim 7.

9. A device as claimed in claim 6, including a multiplicity of said elements positioned side by side, arranged as first and second groups, each group comprising at least a plurality of elements, the elements of one group alternating with those of the other group, and means for establishing a voltage differential between the first and second groups.

10. A sub-wavelength diffraction grating, including a device as claimed in claim 9.

11. A tuneable laser, including a phase section comprising a grating as claimed in claim 10.

12. A varactor device, including a device as claimed in claim 9.

13. An RF-switch, including a device as claimed in claim 9.

14. A device as claimed in claim 6, wherein the longitudinal elements are two dimensional elements.

15. A device as claimed in claim 5, wherein the device is formed a nanoimprint lithography method.

16. A device as claimed in claim 1, wherein each element is formed of conductive material.

17. A device as claimed in claim 1, wherein the device is formed using a CMOS metalization process.

18. A device as claimed in claim 1, including an upper surface coating on each element, the coating having a functional group for reacting with desired molecules to retain the molecules on the upper surface.

19. A sensor for single or a few molecules, including as claimed in claim 18.

20. A device as claimed in claim 1, including a multiplicity of said elements positioned side by side, arranged as first and second groups, each group comprising at least a plurality of elements, the elements of one group alternating with those of the other group, and means for establishing a voltage differential between the first and second groups.

21. A sub-wavelength diffraction grating, including a device as claimed in claim 20.

22. A tuneable laser, including a phase section comprising a grating as claimed in claim 21.

23. A varactor device, including a device as claimed in claim 20.

24. An RF-switch, including a device as claimed in claim 20.

25. A tweezer device for gripping an object such as single molecules, particles or cells, including a device as claimed in claim 1.

26. A tweezer device as claimed in claim 25, including means for passing a heating current through the elements for heating the gripped object.

27. A device for sorting charged molecules, including a plurality of devices, each as claimed in claim 1, with different voltages being applied to different devices.

28. A pump, including a flow conduit, and disposed therein, a device as claimed in claim 1, for pumping fluid.

29. A variable capacitor filter circuit, including a device as claimed in claim 1 for providing a variable capacitance in dependence on the voltage applied.

30. A device as claimed in claim 1, wherein the longitudinal elements are two dimensional elements.

31. A MEMS device comprising an array of two or more longitudinal elements positioned on a substrate, and positioned side by side, the elements being at least in part electrically conductive, and including means for applying a voltage across the elements, wherein the elements are of such nanometric dimensions and materials that the elements can be moved or deformed towards or away from one another by means of the voltage applied across the elements, whereby to produce a desired optical, electronic or mechanical effect, and wherein each element has a portion formed of polymethyl methacrylate.

32. A device as claimed in claim 31, wherein the device is formed using a nanoimprint lithography method.

33. A MEMS device comprising an array of two or more longitudinal elements positioned on a substrate, and positioned side by side, the elements being at least in part electrically conductive, and including means for applying a voltage across the elements, wherein the elements are of such nanometric dimensions and materials that the elements can be moved or deformed towards or away from one another by means of the voltage applied across the elements, whereby to provide a tweezer device for gripping an object such as single molecules, particles or cells, and including means for passing a heating current through said elements for heating the gripped object.

34. A device for sorting charged molecules, including a plurality of MEMS devices, wherein each MEMS device comprises an array of two or more longitudinal elements positioned on a substrate, and positioned side by side, the elements being at least in part electrically conductive, and including means for applying a voltage across the elements, wherein the elements are of such nanometric dimensions and materials that the elements can be moved or deformed towards or away from one another by means of the voltage applied across the elements, and with different voltages being applied to different devices.

35. A MEMS device comprising an array of two or more longitudinal elements positioned on a substrate, and positioned side by side, the elements being at least in part electrically conductive, and including an electrical contact structure arranged for applying voltage across the elements and having a portion disposed at one end of each element, wherein the elements are of such nanometric dimensions and materials that the elements can be deformed towards or away from one another by the voltage applied across the elements, wherein each element is connected to the substrate along a lower longitudinal side thereof and is fixed at said one end thereof, so that only an upper part of the element moves at an opposite end from said one end thereof.

36. A device as claimed in claim 35, wherein each element is formed of insulative material with an upper layer of conductive material.

37. A device as claimed in claim 36, wherein each element has a portion formed of a polymer.

38. A device as claimed in claim 37, wherein each element has a portion formed of polymethyl methacrylate.

39. A device as claimed in claim 37, wherein the device is formed using a nanoimprint lithography method.

40. A device as claimed in claim 35, wherein each element is formed of conductive material.

41. A device as claimed in claim 35, wherein the device is formed using a CMOS metalization process.

42. A tweezer device for gripping an object such as single molecules, particles or cells, including a device as claimed in claim 35.

43. A tweezer device as claimed in claim 42, including means for passing a heating current through the elements for heating the gripped object.

44. A device for sorting charged molecules, including a plurality of devices, each as claimed in claim 35, with different voltages being applied to different devices.

45. A pump, including a flow conduit, and disposed therein, a device as claimed in claim 35, for pumping fluid.

46. A variable capacitor filter circuit, including a device as claimed in claim 35 for providing a variable capacitance in dependence on the voltage applied.

47. A MEMS device comprising a plurality of elongate elements attached to a substrate at points along respective longitudinal dimensions thereof, the elements being at least in part electrically conductive and being at such positions and of such nanometric dimensions and materials that the elements can be deformed laterally towards or away from one another by electrical stimulation.

48. A device as claimed in claim 47, wherein at least one said element is attached to the substrate along substantially the entirety of said longitudinal dimension thereof.

49. A device as claimed in claim 47, wherein at least one said element is attached to the substrate at spaced points along said longitudinal dimension thereof.

50. A device as claimed in claim 47, wherein each element is formed of insulative material, with an upper layer of conductive material.

51. A device as claimed in claim 50, wherein each element has a portion formed of a polymer.

52. A device as claimed in claim 51, wherein the device is formed using a nanoimprint lithography method.

53. A device as claimed in claim 51, wherein each element has a portion formed of polymethyl methacrylate.

54. A device as claimed in claim 47, wherein each element is formed of conductive material.

55. A device as claimed in claim 47, wherein the device is formed using a CMOS metalization process.

56. A device as claimed in claim 47, including an upper surface coating on each element, the coating having a functional group for reacting with desired molecules to retain the molecules on the upper surface.

57. A sensor for single or a few molecules, including a device as claimed in claim 56.

58. A device as claimed in claim 47, including a multiplicity of said elements, arranged as first and second groups, each group comprising at least a plurality of elements, the elements of one group alternating with those of the other group, and structure adapted to establish a voltage differential between the first and second groups.

59. A sub-wavelength diffraction grating, including a device as claimed in claim 58.

60. A tuneable laser, including a phase section comprising a grating as claimed in claim 59.

61. A varactor device, including a device as claimed in claim 58.

62. An RF-switch including a device as claimed in claim 58.

63. A tweezer device for gripping an object such as single molecules, particles or cells, including a device as claimed in claim 47.

64. A tweezer device as claimed in claim 63, including structure adapted to pass a heating current through the elements to heat the gripped object.

65. A device for sorting charged molecules, including a plurality of devices, each as claimed in claim 47, with different voltages being applied to different devices.

66. A pump, including a flow conduit, and disposed therein, a device as claimed in claim 47, for pumping fluid.

67. A variable capacitor filter circuit, including a device as claimed in claim 47 for providing a variable capacitance in dependence on a voltage applied.

68. A device as claimed in claim 47, wherein the elongate elements are two dimensional elements.

\* \* \* \* \*